United States Patent [19]

Ogi et al.

[11] Patent Number: 5,824,456
[45] Date of Patent: *Oct. 20, 1998

[54] COMPOSITION FOR FORMING METAL OXIDE THIN FILM PATTERN AND METHOD FOR FORMING METAL OXIDE THIN FILM PATTERN

[75] Inventors: Katsumi Ogi; Tsutomu Atsuki; Go Sasaki; Tadashi Yonezawa; Nobuyuki Soyama, all of Omiya, Japan

[73] Assignee: Mitsubishi Materials Corporation, Tokyo, Japan

[*] Notice: The term of this patent shall not extend beyond the expiration date of Pat. No. 5,637,440.

[21] Appl. No.: 786,367

[22] Filed: Jan. 16, 1997

Related U.S. Application Data

[63] Continuation of Ser. No. 361,837, Dec. 22, 1994, Pat. No. 5,637,440.

[30] Foreign Application Priority Data

Dec. 27, 1993 [JP] Japan ................................. 5-330971
Mar. 22, 1994 [JP] Japan ................................. 6-50382

[51] Int. Cl.$^6$ ............................ G03F 7/40; G03C 1/492
[52] U.S. Cl. ...................... 430/325; 430/198; 430/270.1; 430/330; 430/919; 430/921
[58] Field of Search .................. 430/270.1, 919, 430/921, 198, 330, 325

[56] References Cited

U.S. PATENT DOCUMENTS

| | | | |
|---|---|---|---|
| 3,880,659 | 4/1975 | Bailey et al. | 430/147 |
| 3,887,372 | 6/1975 | Bailey | 430/147 |
| 3,887,374 | 6/1975 | Brongo et al. | 430/147 |
| 4,284,704 | 8/1981 | Fleming et al. | 430/154 |
| 4,740,320 | 4/1988 | Treybig et al. | 507/243 |
| 5,155,004 | 10/1992 | Kojima | 430/223 |
| 5,230,983 | 7/1993 | Inoue et al. | 430/264 |
| 5,234,802 | 8/1993 | Nakamura et al. | 430/403 |
| 5,244,784 | 9/1993 | Moriya et al. | 430/642 |
| 5,304,456 | 4/1994 | Ueda et al. | 430/270 |
| 5,591,381 | 1/1997 | Walker | 252/389.54 |
| 5,637,440 | 6/1997 | Ogi et al. | 430/270.1 |

OTHER PUBLICATIONS

Hackh's Chemical Dictionary, Grant, ed. (1972) p. 334.

*Primary Examiner*—Bernard P. Codd
*Attorney, Agent, or Firm*—Kubovick & Kubovick

[57] ABSTRACT

A composition for forming a metal oxide thin film pattern which is a solution containing one or more hydrolytic metal compounds selected from the group consisting of hydrolytic organometallic compounds (e.g., metal alkoxide) and metal halides, and a water generating agent which frees water under the effect of irradiation with active rays (e.g., o-nitrobenzyl alcohol and 2-nitroethanol) and, as required, an acid generating agent which frees acid under the effect of irradiation with active rays is disclosed. A thin film pattern is formed by coating the composition onto a substrate, irradiating active rays for forming an image on the resultant photosensitive coating film, developing the same with water or an alcoholic solvent to remove the non-exposed portion, and heat-treating the substrate to convert the remaining film into a metal oxide, thereby forming a negative-type metal oxide thin film pattern.

18 Claims, No Drawings

COMPOSITION FOR FORMING METAL OXIDE THIN FILM PATTERN AND METHOD FOR FORMING METAL OXIDE THIN FILM PATTERN

This is a continuation of application Ser. No. 08/361,837 filed Dec. 22, 1994 now U.S. Pat. No. 5,637,440.

FIELD OF THE INVENTION

The present invention relates to a composition for forming a metal oxide thin film pattern, which is sensitive to active rays such as ultraviolet rays, an electron beam, an ion beam or X-rays, and a method for forming a metal oxide thin film pattern by means thereof.

DESCRIPTION OF THE RELATED ART

A metal oxide thin film is used in various devices in the form of a capacitor film, an optical wave guide and an optical element because of its electrical and optical properties. When using a metal oxide thin film in such a device, it is usually necessary to form a thin film pattern so as to form a prescribed circuit.

A metal oxide thin film pattern has conventionally been formed, after forming a metal oxide thin film on a substrate by any of a CVD method, sputtering method, and sol-gel method, through an ordinary resist patterning process comprising the steps of (1) applying a resist, (2) drying, as required, the resist by heating, (3) exposing the dried resist to radiation to form an image, (4) developing the exposed resist, (5) etching the metal oxide on the exposed portion, and (6) removing the resist.

The conventional thin film patterning method using the resist has the following problems:

(a) the process is complicated, resulting in a high cost;

(b) when the thin film is of composite metal oxides, specific elements are preferentially etched causing a shift in the resultant thin film composition; and (c) waste treatment of a liquid such as a strong acid used for etching the metal oxide is troublesome.

OBJECT AND SUMMARY OF THE INVENTION

An object of the present invention is to provide a composition which permits formation of a metal oxide thin film pattern on a substrate and a method for forming a metal oxide thin film pattern, without using a resist.

Another object of the present invention is to provide a composition for forming a metal oxide thin film pattern, which permits formation of a thin film pattern by irradiation with active rays of energy of a slight amount, and a method for forming same.

The composition for forming a metal oxide thin film pattern of the first aspect of the present invention comprises a solution containing one or more hydrolytic metal compounds selected from the group consisting of hydrolytic organometallic compounds and metal halides, and a photosensitizer which forms water when irradiated with active rays.

The method for forming a metal oxide thin film pattern of the second aspect of the present invention comprises the steps of applying the composition of the first aspect onto a substrate, exposing the resultant film to active rays to form an image, developing the same with a solvent to remove a non-exposed portion, and then subjecting the same to a heat treatment to convert the exposed film portion into a metal oxide.

The composition for forming a metal oxide thin film pattern of the third aspect of the present invention comprises a solution containing hydrolytic metal compounds and one or more compounds selected from the group consisting of 2-nitroethanol, formaldehyde, tartaric acid, 2-hydroxybenzyl alcohol, 2-carboxybenzyl alcohol, 2-carboxybenzaldehyde, 2-nitrobenzaldehyde, and phthalic acid.

The method for forming a metal oxide thin film pattern of the fourth aspect of the present invention comprises the steps of applying the composition of the third aspect as described above onto a substrate, exposing the resultant film to active rays to form an image, developing the same with a solvent to remove a non-exposed portion, and then subjecting the same to a heat treatment to convert the exposed film portion into a metal oxide.

The present inventors previously proposed the possibility of forming a negative type metal oxide pattern without using a resist on the basis of the discovery that a coated film of a solution containing a metal alkoxide and a metal carboxylate, used for forming a metal oxide thin film by the sol-gel method, had sensitivity to radiation, and by utilization of this sensitivity, only a non-exposed portion could be removed by irradiating the coated film of the above-mentioned solution to harden the exposed portion thus irradiated (Japanese Laid Open Patent Publication No. 6-172,068).

Further studies relating to this method gave the following findings. By modifying the composition to contain a photosensitizer which forms water under the effect of irradiation, water produced at an exposed portion accelerates polymerization through hydrolysis at the exposed portion. As a result, it is possible to make a large difference in solubility between exposed and non-exposed portions with a smaller amount of irradiated energy, thus making it easier to remove the non-exposed portion. As this photosensitizer, specific compounds exhibit excellent properties. Furthermore, by adding a photosensitizer which separates an acid under the effect of irradiation to the composition, an acid produced at the exposed portion further accelerates the hardening reaction, thus permitting a larger exposed portion to be obtained. The present inventors have thus developed the present invention.

DESCRIPTION OF PREFERRED EMBODIMENTS

The present invention is described below in further detail.

Hydrolytic metal compounds useful in the present invention include hydrolytic organometallic compounds and metal halides.

There is no particular limitation as to the hydrolytic organometallic compounds as long as a metal hydroxide can be formed from the compound through hydrolysis. Typical examples include metal alkoxides, metal acetylacetonate complexes and metal carboxylates. A preferred metal alkoxide is a lower alkoxide such as an ethoxide, propoxide, isopropoxide, butoxide or isobutoxide. Similarly, a preferred metal carboxylate is a metal compound of a lower aliphatic acid such as an acetate or propionate.

As the metal halide, a chloride can be used.

For each metal element, one or more hydrolytic metal compounds can be used as a raw material.

There is no particular limitation regarding the metal in the hydrolytic metal compounds, but it is preferred to select a hydrolytic metal compound corresponding to the thin film of the applied metal oxide (two or more metal elements in the case of composite oxides).

The composition and the method of the present invention are suitable for the formation of a thin film pattern of metal oxides (including both composite metal oxides and single metal oxides) such as lead titanate zirconate (PZT), lanthanum-containing lead titanate zirconate (PLZT), strontium titanate (STO), barium titanate (BTO), barium-strontium titanate (BSTO), bismuth titanate ($Bi_4Ti_3O_{12}$), tantalum oxide ($Ta_2O_5$), titanium dioxide ($TiO_2$), lead oxide (PbO), zirconium dioxide ($ZrO_2$), alumina ($Al_2O_3$), tin dioxide ($SnO_2$), and ruthenium dioxide ($RuO_2$). To form thin films of these metal oxides, hydrolytic organometallic compounds and/or metal halides of the metals of these metal oxides are employed.

The composition of the present invention can contain only one or both of a hydrolytic organometallic compound and a metal halide.

The composition of the present invention contains, together with the above-mentioned hydrolytic metal compound, a photosensitizer which releases water by irradiation of active rays (hereinafter referred to as "water generating agent") for the following reasons.

The hydrolytic metal compound used in the present invention is subjected to hydrolysis through reaction with water, and transforms into a gel through a sol of a water-containing metal oxide. As the reaction proceeds further, a polymerization reaction takes place, wherein a combination of the metal and oxygen achieves a three-dimensional bridge, resulting in hardening of the film.

As described above, the hydrolytic metal compound is sensitive to the radiation. Upon irradiation, the polymerization reaction preferentially takes place in the exposed portion, and as a result, the film therein becomes denser and harder. This produces a difference in solubility between the exposed and the non-exposed portions, and by the utilization of this phenomenon, it is possible to form a pattern.

By previously adding the water generating agent, together with the hydrolytic metal compound as described above, to form the composition, water released from the water generating agent by the irradiation with the active rays can accelerate considerably the hardening reaction of the above-mentioned hydrolytic metal compound. In other words, water generated by the water generating agent serves as a kind of hardening catalyst. In the portion exposed to the active rays, therefore, the hardening reaction of the film proceeds to a considerable extent, and as compared with a case without the addition of the water generating agent, the difference in solubility between the exposed and the non-exposed portions becomes considerably large. Since the water generating agent has a higher sensitivity to active rays than the hydrolytic metal compound itself, the above-mentioned hardening reaction can be started and promoted with a smaller amount of active ray energy.

As the water generating agent, any compound capable of forming water through a dehydration reaction which takes place within or between molecules by irradiation with active rays can be used. Useful compounds include an aromatic organic compound having an active ray sensitivity and containing electron attractive groups such as a nitro group and electron donative groups such as a hydroxyl group within a molecule. The electron attractive group and the electron donative group should preferably be present in relatively close proximity to each other. Examples of such compounds include O-nitrobenzyl alcohol, and 1-hydroxymethyl-2-nitronaphthalene. In the case of O-nitrobenzyl alcohol, for example, dehydration occurs within a molecule through the reaction:

$$C_6H_4(CH_2OH)NO_2 \rightarrow C_6H_4(CHO)NO+H_2O$$

and water is generated.

In the third aspect of the present invention, one or more compounds selected from the group consisting of 2-nitroethanol, formaldehyde, tartaric acid, 2-hydroxybenzyl alcohol, 2-carboxybenzyl alcohol, 2-carboxybenzaldehyde, 2-nitrobenzaldehyde and phthalic acid are used specifically as the water generating agent. These water generating agents, when irradiated with active rays, undergo a dehydration reaction to generate water.

In the composition of the present invention, a photosensitizer which frees acid by irradiation of active rays (hereinafter referred to as "acid generating agent") can be used simultaneously with the water generating agent, with a view to further accelerating the hydrolysis reaction of the hydrolytic metal compound by the water generating agent. In the presence of the acid generating agent, acid generated by irradiation with active rays on the exposed portion acts as a catalyst for the hardening reaction of the hydrolytic metal compound to further promote hardening, thus further increasing the difference in solubility between the exposed and the non-exposed portions and enabling the amount of irradiation to be further reduced.

As the acid generating agent capable of being used simultaneously with the water generating agent in the present invention, any of those compounds conventionally known in the area of photoresist can be used. Applicable acid generating agents include:

(1) onium salts such as an iodonium salt and sulfonium salt;

(2) organic halides such as an halogen-containing benzene derivative, an halogen-containing alkane or cycloalkane, and an halogen-containing s-triazine or isocyanurate derivative;

(3) o- or p-nitrobenzylester; and (4) an aromatic sulfonic ester or sulfonyl compound such as a benzene polysulfonic ester, bisallylsulfonyl diazomethane, and 2-phenylsulfonylacetophenone.

One or more kinds of both the water generating agents and the acid generating agents can be used.

The composition for forming a metal oxide thin film pattern of the present invention can be prepared by dissolving a raw material hydrolytic metal compound in an appropriate organic solvent (e.g., ethanol, isopropanol, 2-methoxyethanol or other alcohol; acetic acid, propionic acid or other lower aliphatic carboxylic acids), adding a water generating agent (or a water generating agent and an acid generating agent) to the resultant solution, and causing dissolution thereof. When the object is a composite oxide thin film pattern, two or more raw material hydrolytic metal compounds are used in a ratio corresponding to the ratio of the individual metals in the composite oxide.

The concentration of the hydrolytic metal compound or compounds in the composition should preferably be within a range of from 1 to 20 wt. %. The quantity of water generating agent should be within a range of from 0.001 to 20 wt. %, or more preferably, from 0.1 to 10 wt. %, relative to the total weight of the composition.

A quantity of added water generating agent smaller than the prescribed range cannot bring about a large difference in solubility between the exposed and the non-exposed portions, thus making it impossible to form a clear pattern. With a quantity of added water generating agent larger than the prescribed range, irradiation causes denaturation of the coated film of even the surrounding non-exposed portion, thus also making it impossible to form a clear pattern. When simultaneously adding the acid generating agent, the quantity thereof should be within a range of from 0.001 to 20 wt. %, or more preferably, from 0.1 to 10 wt. %, relative to the total weight of the composition. In this case, the sum of the quantities of the water generating agent and the acid generating agent should preferably be up to 20 wt. % of the total weight of the composition.

A chelating compound such as acetylacetone, ethanolamine and ethyl oxo-butanoic acid can be added as a stabilizing agent which prevents gelation during storage. The chelating compound is added in an amount of from 0.05 to 10 mol relative to 1 mol of the hydrolytic metal compound in the resultant solution.

While there is no particular limitation on the method for applying this composition to the substrate so far as it permits formation of a film having a uniform thickness, a spin-coat method is commonly adopted for industrial purposes. As required, a desired film thickness can be obtained by repeating the application operation after gelation of the film. It is also possible to increase the film thickness of the metal oxide thin film in the present invention, since irradiation is possible with a smaller amount of energy through addition of the water generating agent The metal oxide thin film formed with the composition of the present invention should preferably have a thickness (in general) within a range of from 0.01 to 0.2 µm.

The resultant film loses its fluidity if held for a short period of time, and permits exposure. The holding time can be set so as to dry the film (i.e., so as to cause the film to lose its fluidity) to the extent of permitting irradiation with active rays for forming an image, and is usually within a range of from several seconds to several minutes.

Then, the film is exposed for image formation by irradiation with active rays to form an image corresponding to a desired pattern. Applicable active rays vary with the adopted photosensitizer (water generating agent and acid generating agent) and generally include ultraviolet rays, an electron beam, an ion beam and X-rays. The source of ultraviolet rays can be, for example, a low-voltage mercury lamp, or an excimer laser. The image-forming exposure can be conducted by irradiating the active rays through a mask by a conventional method, or when the active-ray source is a laser, by a direct drawing method consisting of irradiating a patterned laser beam. The amount of energy of irradiation is not specifically limited, but an amount of at least 100 mJ/cm$^2$ suffices, varying however with the film thickness and the kind of the photosensitizer.

As a result of irradiation with the active rays, the hardening reaction, the hydrolysis reaction and the polymerization reaction of the above-mentioned coated film proceed in the exposed portion, and the coated film becomes harder and denser, so that solubility thereof in a solvent such as an alcohol decreases. In the present invention in which the water generating agent is present, the hardening reaction of the exposed portion can be selectively promoted with a smaller amount of irradiation energy of the active rays. The objective of irradiation can be sufficiently achieved, not only with rays having a very high energy density such as an electron beam, but also with ultraviolet rays having an energy density lower than this. In the simultaneous presence of the acid generating agent in the film, acid generated in the exposed portion further accelerates the hardening reaction of the film.

As required, the film can be held, after irradiation, in a dry inert gas (such as nitrogen or argon) atmosphere at 40° to 100° C. for one to ten minutes. By thus maintaining the temperature while shutting the film off from moisture in the air, it is possible to further promote selectively the hardening reaction of the film of the exposed portion, thus further increasing the difference in solubility between the exposed and the non-exposed portions.

After irradiation, the film can be dried, as required, by fully heating the substrate. This eliminates moisture and organic solvent remaining in the exposed portion which forms the target pattern. It suffices to perform this full heating, for example, at 100° to 150° C. for about five to ten minutes.

Thereafter, a negative-type pattern comprising the exposed portion is formed on the substrate by removing the non-hardening film portion on the non-exposed portion through development by means of an appropriate solvent. Any solvent which can dissolve the material of the non-exposed portion and has a small solubility against the hardened film of the exposed portion can be used as the developing agent. Use of water or an alcohol is preferable. Suitable alcohols include alkoxyalcohols such as 2-methoxyethanol and 2-ethoxyethanol. When this type of alcohol is so high in solubility as to cause dissolution of the exposed portion, solubility can be adjusted by adding an alkyl alcohol such as ethyl alcohol or isopropyl alcohol (IPA). It is not, therefore, necessary to use a strong corrosive acid such as mixed fluoric/hydrochloric acid for development, and the possibility of accomplishing development with a safe and inexpensive solvent without corrosive action such as an alcohol is one of the important advantages of the present invention.

Development can be conducted, for example, by immersing the film in the solvent at room temperature for about ten seconds to ten minutes. Conditions of development are set so that the non-exposed portion is completely eliminated and the exposed portion is not substantially removed. The conditions of development vary, therefore, with the amount of irradiated active rays, use of a heat treatment, and the kind of solvent used for development.

With a view to preventing dissolution of the film in excess of the necessary level after removal of the non-exposed portion in the development step, it is desirable to perform rinsing with an appropriate organic solvent having no or only a very slight solubility for the film in the exposed portion. For example, esters (e.g., ethyl acetate), ketones (e.g., methyl ethyl ketone, methyl isobutyl ketone), and hydrocarbons (e.g., toluene, n-hexane) are useful as the rinsing liquid. An alcohol having a relatively low polarity such as isopropyl alcohol can also be used as the rinsing liquid.

A negative-type film pattern comprising the remaining exposed portion is formed on the substrate, Thereafter, a thin film pattern comprising a metal oxide of a desired composition is formed by converting the metal compounds in the film fully into metal oxides through heat treatment of the substrate. This heat treatment should preferably be carried out through sintering in an open air atmosphere at 300° to 800° C. for one second to two hours.

Another metal oxide thin film pattern of a different kind or of the same kind can be laminated by the same method on the thus formed metal oxide thin film pattern.

In the method of the present invention, the film of the composition of the invention is thus formed, and after image-forming exposure, the non-exposed portion is eliminated through contact with a solvent. Thereafter, the product of the exposed portion is converted to a thin film of metal oxides by heat treatment.

When using a compound having a property of being polymerized by active rays as the hydrolytic organic metal compound, a polymerization reaction proceeds in parallel with the above-mentioned hydrolysis reaction, and this also serves to reduce solubility against a solvent (as compared with the absence of irradiation).

Now, the present invention is described in further detail by means of examples. The present invention is not limited, of course, to these examples. A photo-mask having a line-and-space width of 10 μm (lines, each having a width of 10 μm, arranged at intervals of 10 μm) was used in the examples.

Metal oxide thin film patterns formed in the Examples were evaluated by measuring the line width of the thin film pattern through microscopic observation. When the thus measured line width (average over ten measuring points) was within ±5% of the line width of the mask pattern, the formed thin film pattern was marked good, and a case where there was a film defect of over 5% was marked poor.

EXAMPLE 1

This experiment presents an example of a negative-type PZT thin film pattern having a composition: $PbZr_{0.52}Ti_{0.48}O_3$.

Lead acetate $[Pb(CH_3COO)_2.3H_2O]$ in an amount of 11.84 g was dissolved in 70 g of 2-methoxyethanol, and the resultant solution was heated to 140° C. for sufficient dehydration. Commercially available zirconium n-butoxide $[Zr(O(CH_2)_3CH_3)_4]$ in an amount of 6.87 g and titanium isopropoxide $[Ti(OCH(CH_3)_2)_4]$ in an amount of 4.09 g were added to this solution. The solution was then diluted with 2-methoxyethanol so as to achieve a total weight of 100 g, and o-nitrobenzyl alcohol $(C_6H_4NO_2.CH_2OH)$ in an amount of 2 g was added as a water generating agent. In the thus prepared composition for forming a metal oxide thin film pattern (hereinafter referred to as a "coating solution"), the individual metals had an atomic ratio of Pb:Zr:Ti= 1:0.52:0.48.

This coating solution was applied by a spin-coat method onto a platinum substrate under conditions of 3,000 rpm for 15 seconds to manufacture a coated film. After leaving this coated film at room temperature for one minute, far-ultraviolet rays (central wavelength: 254 nm) from a low-voltage mercury lamp were irradiated through a mask pattern onto the coated film. The amount of irradiation was 900 mJ/cm$^2$, and a photo-mask of a line-and-space width of 10 μm (10 μm-wide lines were arranged at intervals of 10 μm) was employed. After irradiation of the ultraviolet rays, the substrate was dried by heating in a dryer at 100° C. for one minute. Then, for development, the substrate was immersed in an etching solution (2-methoxyethanol) at room temperature for one minute to completely dissolve and remove the non-exposed portion of the film. Then, the substrate was immersed in a rinsing solution IPA (isopropyl alcohol) at room temperature for five seconds. Subsequently, the film was sintered in an open air atmosphere at 400° C. for ten minutes, and further in an open air atmosphere at 600° C. for 60 minutes to form a negative-type thin film pattern of PZT having a thickness of about 600 Å.

The resultant PZT thin film was confirmed, through X-ray diffraction, to have a perovskite structure, and through EPMA and XPS analyses, to have a composition $PbZr_{0.52}Ti_{0.48}O_3$. A satisfactory thin film pattern was obtained.

A similar result was available also in a case where a KrF excimer laser generating a single wavelength of 249 nm as an ultraviolet ray source was irradiated in the same quantity. In this example, a good negative-type PZT thin film pattern could be formed with a quantity of irradiated ultraviolet rays of at least 100 mJ/cm$^2$ (or more preferably, at least 500 mJ/cm$^2$).

Even when the solvent used for development was replaced with a mixed solution of 2-methoxyethanol and IPA (mixing ratio in volume: 1:1), a similar satisfactory negative-type pattern was obtained.

EXAMPLE 2

The same steps as in Example 1 were repeated, except that ultraviolet rays were irradiated in a quantity of 500 mJ/cm$^2$, and, after the irradiation, the substrate was heated in a dried nitrogen atmosphere at 50° C. for one minute, and then drying was carried out in a dryer. Development and sintering conditions were the same as in Example 1. A satisfactory perovskite-type PZT thin film pattern was formed as in Example 1.

Comparative Example 1

Formation of a PZT thin film pattern was attempted as in Example 1, except that o-nitrobenzyl alcohol as a water generating agent was not added to the composition. There was almost no difference in solubility between the exposed and the non-exposed portions after irradiation with ultraviolet rays, and after heating for the purpose of drying, development with water or 2-methoxyethanol or a mixed solvent of 2-methoxyethanol and IPA could not selectively eliminate the non-exposed portion.

EXAMPLES 3 TO 16

Solutions comprising the hydrolytic raw material metal compounds and solvents shown in Table 1 were prepared in the same manner as in Example 1, and a coating solution for forming an oxide thin film having a target composition was prepared by adding thereto o-nitrobenzyl alcohol as a water generating agent in an amount of 2 wt. % relative to the weight of the solution. A metal oxide thin film pattern was formed by means of each of these coating solutions in the same manner as in Example 1. The coating thickness was about 600 Å in all cases. Development was performed with the use of a mixed solvent of 2-methoxyethanol and IPA and rinsing was performed with the use of n-hexane. In all cases, a satisfactory negative-type thin film pattern comprising a metal oxide having a composition as shown in Table 1 could be obtained after sintering.

TABLE 1

| | | Composition for forming metal oxide thin film | | |
|---|---|---|---|---|
| Example No. | Composition of metal oxide thin film | Hydrolytic raw material metal compound | Solvent | Concentration as converted into metal oxide (%) |
| 3 | $PbTiO_3$ | $Pb(OCOCH_3)_2$, $Ti(OCH(CH_3)_2)_4$ | 2-methoxyethanol | 10 |
| 4 | $Pb_{0.91}La_{0.09}Zr_{0.65}Ti_{0.36}O_3$ | $Pb(OCOCH_3)_2$, $La(OCOCH_3)_3$, $Zr(O(CH_2)_3CH_3)_4$, $Ti(OCH(CH_3)_2)_4$ | 2-methoxyethanol | 10 |
| 5 | $Pb_{0.6}La_{0.2}TiO_3$ | $Pb(OCOCH_3)_2$, $La(OCOCH_3)_3$, $Ti(OCH(CH_3)_2)_4$ | 2-methoxyethanol | 10 |
| 6 | $SrTiO_3$ | $Sr(OCH_2CH_3)_2$, $Ti(OCH(CH_3)_2)_4$ | 2-methoxyethanol | 5 |
| 7 | $Ba_{0.5}Sr_{0.5}TiO_3$ | $Ba(OCH_2CH_3)_2$, $Sr(OCH_2CH_3)_2$, $Ti(OCH(CH_3)_2)_4$ | 2-methoxyethanol | 5 |
| 8 | $PbMg_{0.33}Nb_{0.67}O_3$ | $Pb(OCOCH_3)_2$, $Mg(OCH_2CH_3)_2$, $Nb(OCH_2CH_3)_5$ | 2-methoxyethanol | 10 |
| 9 | $Bi_4Ti_3O_{12}$ | $BiO(OCOCH_3)$, $Ti(OCH(CH_3)_2)_4$ | Acetic acid | 5 |
| 10 | ZnO—Al | $Zn(OCH_2CH_3)_2$, $Al(OCH(CH_3)_2)_3$ | 2-methoxyethanol | 5 |
| 11 | $SnO_2$—Sb | $Sn(OC(CH_3)_3)_4$, $Sb(O(CH_2)_3CH_3)_5$ | n-butanol | 6 |
| 12 | $In_2O_3$—Sn | $In(OCH_2CH_3)_3$, $Sn(OC(CH_3)_3)_4$ | n-butanol | 5 |
| 13 | $TiO_2$ | $Ti(OCH(CH_3)_2)_4$ | 2-methoxyethanol | 5 |
| 14 | $SiO_2$ | $Si(OCH_2CH_3)_4$ | Isopropyl alcohol | 5 |
| 15 | $RuO_2$ | $RuCl_4$ | Ethanol | 5 |
| 16 | $LiNbO_3$ | $Li(OCH_2CH_3)$, $Nb(OCH_2CH_3)_5$ | Ethanol | 5 |

EXAMPLE 17

[$Pb(CH_3COO)_2 \cdot 3H_2O$] in an amount of 11.84 g was dissolved in 2-methoxyethanol serving as the solvent, and the mixture was heated for dehydration. [$Zr(O(CH_2)_3CH_3)_4$] in an amount of 6.87 g and [$Ti(OCH(CH_3)_2)_4$] in an amount of 4.09 g were added to the mixture, and the resultant solution was diluted with 2-methoxyethanol to achieve a weight of the entire solution of 100 g. To this solution, 2 g of o-nitrobenzyl alcohol, a water generating agent, and 0.5 g of 2-phenylsulfonylacetophenone [$C_6H_5SO_2CH_2COC_6H_5$], an acid generating agent, were added and dissolved, to prepare a coating solution. With the use of this coating solution, coating and irradiation with ultraviolet rays were conducted in the same manner as in Example 1. The amount of irradiated ultraviolet rays was 700 mJ/cm². After irradiation of ultraviolet rays and drying, the film was immersed in 2-methoxyethanol for one minute for development. Thereafter, the film was immersed in IPA as a rinsing solution, and sintered in the same manner as in Example 1 to obtain a satisfactory negative-type pattern comprising an oxide thin film (PZT thin film) having a thickness of about 600 Å. Perovskite-type PZT was confirmed through an X-ray diffraction analysis.

Even when the ultraviolet ray source was replaced with a KrF laser, or when the solvent for development was replaced with a mixed solvent of 2-methoxyethanol and IPA, similar negative-type patterns were obtained.

Comparative Example 2

Formation of a PZT thin film pattern was attempted in the same manner as in Example 4, except that neither o-nitrobenzyl alcohol (as a water generating agent) nor 2-phenylsulfonylacetophenone (as an acid generating agent) was added to the composition. After irradiation with ultraviolet rays, there was almost no difference in solubility between the exposed and the non-exposed portions, and immersion in a solvent for development (water, or 2-methoxyethanol, or a mixed solvent of 2-methoxyethanol and IPA) after drying by heating did not permit selective dissolution and removal of the non-exposed portion.

EXAMPLE 18

A composition for forming a metal oxide film pattern (coating solution) was prepared in the same manner as in Example 1, except that 2.9 g of 2-nitroethanol ($C_2H_5NO_3$) were added as the water generating agent. The atomic ratio of the individual metals contained in the coating solution was Pb:Zr:Ti=1:0.52:0.48.

This coating solution was applied onto a platinum substrate in the same manner as in Example 1, and irradiation with far-ultraviolet rays, etching, rinsing and sintering were carried out also in the same manner as in Example 1. The amount of irradiation was 1,200 mJ/cm².

The resultant PZT thin film was confirmed to have a perovskite-type structure through X-ray diffraction and through EPMA and XPS analysis to have a composition: $PbZr_{0.52}Ti_{0.48}O_3$. The thin film obtained had a satisfactory thin film pattern.

When a KrF excimer laser generating a single wavelength of 249 nm was used as an ultraviolet-ray source, a similar result was obtained. In this example, a satisfactory negative-type PZT thin film pattern could be formed with an ultraviolet-ray irradiation energy of at least 100 mJ/cm (or more preferably, at least 500 mJ/cm²).

A similar satisfactory negative-type pattern was obtained even when the solvent used for development was replaced with a mixed solution of 2-methoxyethanol and IPA (mixing ratio in volume: 1:1).

EXAMPLE 19 TO 26

PZT thin films were formed in the same manner as in Example 18, except that the water generating agents as shown in Table 2 were used and the amounts of irradiated ultraviolet rays, the etching liquids and the etching times as shown in Table 2 were used. As a result, satisfactory thin film patterns were obtained in all cases. These thin films had a perovskite structure, and were confirmed to have a composition:

$PbZr_{0.52}Ti_{0.48}O_3$.

TABLE 2

| Example No. | Water generating agent | Amount of irradiated ultraviolet rays (mJ/cm$^2$) | Etching liquid | Etching time (min) |
|---|---|---|---|---|
| 19 | 2-nitroethanol | 1200 | 2-methoxyethanol | 1 |
| 20 | Formaldehyde | 1000 | 2-methoxyethanol + IPA | 1 |
| 21 | Tartaric acid | 1100 | 2-methoxyethanol + IPA | 1 |
| 22 | 2-hydroxybenzyl alcohol | 900 | 2-methoxyethanol | 5 |
| 23 | 2-carboxybenzyl alcohol | 900 | 2-methoxyethanol + IPA | 5 |
| 24 | 2-carboxybenzaldehyde | 900 | 2-methoxyethanol | 5 |
| 25 | 2-nitrobenzaldehyde | 900 | 2-methoxyethanol | 5 |
| 26 | Phthalic acid | 1100 | 2-methoxyethanol + IPA | 3 |

IPA: Isopropyl alcohol (mixing volume ratio with 2-methoxyethanol: 1:1)

Comparative Example 3

Formation of a PZT thin film pattern was attempted in the same manner as in Example 18, except that 2-nitroethanol, as a water generating agent, was not added to the composition. There was almost no difference in solubility between the exposed and the non-exposed portions after irradiation with ultraviolet rays, and even when development was attempted with water or 2-methoxyethanol, or a mixed solvent of 2-methoxyethanol and IPA, after heating to dry, the non-exposed portion could not selectively be removed.

EXAMPLES 27 TO 40

Solutions comprising the hydrolytic metal compounds and solvents shown in Table 3 were prepared in the same manner as in Example 18. (When using two or more hydrolytic organic metal compounds, the mixing ratio was set to match the stoichiometric ratio of the metals of the target metal oxides.) Coating solutions for forming an oxide thin film of the target chemical composition were prepared by adding, to these solutions, 2-nitroethanol serving as a water generating agent in an amount of 2 wt. % relative to the solutions. With the use of each of these coating solutions, a metal oxide thin film was formed in the same manner as in Example 18. The coating had a thickness of about 600 Å in each case, and the film was developed with 2-methoxyethanol and rinsed with n-hexane. In each case, a satisfactory thin film pattern comprising a metal oxide of the composition shown in Table 3 was obtained after sintering.

TABLE 3

| Example No. | Composition of metal oxide thin film (ratio in ( ) represents mol ratio) | Composition for forming metal oxide thin film | | Concentration as converted into metal oxide (%) |
|---|---|---|---|---|
| | | Hydrolytic metal compound | Solvent | |
| 27 | PbTiO$_3$ | Pb(OCOCH$_3$)$_2$, Ti(OCH(CH$_3$)$_2$)$_4$ | 2-methoxyethanol | 10 |
| 28 | Pb$_{0.91}$La$_{0.09}$Zr$_{0.65}$Ti$_{0.36}$O$_3$ | Pb(OCOCH$_3$)$_2$, La(OCOCH$_3$)$_3$, Zr(O(CH$_2$)$_3$CH$_3$)$_4$, Ti(OCH(CH$_3$)$_2$)$_4$ | 2-methoxyethanol | 10 |
| 29 | Pb$_{0.8}$La$_{0.2}$TiO$_3$ | Pb(OCOCH$_3$)$_2$, La(OCOCH$_3$)3, Ti(OCH(CH$_3$)$_2$)$_4$ | 2-methoxyethanol | 10 |
| 30 | SrTiO$_3$ | Sr(OCH$_2$CH$_3$)$_2$, Ti(OCH(CH$_3$)$_2$)$_4$ | 2-methoxyethanol | 5 |
| 31 | Ba$_{0.5}$Sr$_{0.5}$TiO$_3$ | Ba(OCH$_2$CH$_3$)$_2$, Sr(OCH$_2$CH$_3$)$_2$, Ti(OCH(CH$_3$)$_2$)$_4$ | 2-methoxyethanol | 5 |
| 32 | PbMg$_{0.33}$Nb$_{0.67}$O$_3$ | Pb(OCOCH$_3$)$_2$, Mg(OCH$_2$CH$_3$)$_2$, Nb(OCH$_2$CH$_3$)$_5$ | 2-methoxyethanol | 10 |
| 33 | Bi$_4$Ti$_3$O$_{12}$ | BiO(OCOCH$_3$), Ti(OCH(CH$_3$)$_2$)$_4$ | Acetic acid | 5 |
| 34 | ZnO—Al$_2$O$_3$ (1:1) | Zn(OCH$_2$CH$_3$)$_2$, Al(OCH(CH$_3$)$_2$)$_3$ | 2-methoxyethanol | 5 |
| 35 | SnO$_2$—Sb$_2$O$_3$ (1:1) | Sn(OC(CH$_3$)$_3$)$_4$, Sb(O(CH$_2$)$_3$CH$_3$)5 | n-butanol | 6 |
| 36 | In$_2$O$_3$—Sn$_2$O$_3$ (1:1) | In(OCH$_2$CH$_3$)$_3$, Sn(OC(CH$_3$)$_3$)$_4$ | n-butanol | 5 |
| 37 | TiO$_2$ | Ti(OCH(CH$_3$)$_2$)$_4$ | 2-methoxyethanol | 5 |
| 38 | SiO$_2$ | Si(OCH$_2$CH$_3$)$_4$ | Isopropyl alcohol | 5 |
| 39 | RuO$_2$ | RuCl$_4$ | Ethanol | 5 |
| 40 | LiNbO$_3$ | Li(OCH$_2$CH$_3$), Nb(OCH$_2$CH$_3$)$_5$ | Ethanol | 5 |

EXAMPLE 41

[Pb(CH$_3$COO)$_2$·3H$_2$O] in an amount of 11.84 g was dissolved in 2-methoxyethanol serving as the solvent, and the resultant solution was heated to cause dehydration. [Zr(O(CH$_2$)$_3$CH$_3$)$_4$] in an amount of 6.87 g and [Ti(OCH(CH$_3$)$_2$)$_4$] in an amount of 4.09 g were added to this solution, and the solution was diluted with 2-methoxyethanol to achieve a weight of the entire solution of 100 g. To this solution, 2 g of 2-nitroethanol, a water generating agent, and 0.5 g of 2-phenylsulfonylacetophenone [C$_6$H$_5$SO$_2$CH$_2$COC$_6$H$_5$], an acid generating agent, were added and dissolved, to prepare a coating solution. With the use of this coating solution, coating and irradiation with ultraviolet rays were conducted in the same manner as in Example 18. The amount of irradiated ultraviolet rays was 700 mJ/cm$^2$. After irradiation and drying, the film was immersed in 2-methoxyethanol for one minute for development. Thereafter, the film was immersed in IPA as a rinsing solution, and sintered in the same manner as in Example 18 to obtain a satisfactory negative-type pattern comprising an oxide thin film (PZT thin film) having a thickness of about 600 Å. Perovskite-type PZT was confirmed through an X-ray diffraction analysis.

Even when the ultraviolet-ray source was replaced with a KrF laser, or when the solvent for development was replaced with a mixed solvent of 2-methoxyethanol and IPA, similar negative-type patterns were obtained.

According to the present invention, as is clear from the results presented above, it is possible to form a negative-type metal oxide thin film pattern by using the sol-gel method and without using a resist. It is therefore possible to simplify the device manufacturing process and improve the efficiency thereof. Because of the utilization of the sol-gel method, a film can be formed at a lower cost more efficiently as compared with a gas phase method such as CVD or sputtering, and a larger area can easily be achieved, with almost no change in composition.

In the present invention, furthermore, a water generating agent is present in the coated film. This permits formation of a pattern with a smaller amount of irradiating energy, and the obtaining of a clear pattern by the use of an industrial ultraviolet-ray irradiating apparatus. Since development can be accomplished with a relatively safe and inexpensive solution that is free from corrosive action such as an alcohol, liquid waste treatment is simple.

The use of an acid generating agent, in combination with the water generating agent, makes it possible to form a pattern with an even smaller irradiating energy.

What is claimed is:

1. A composition for forming a metal oxide thin film pattern, which comprises a solution containing one or more hydrolytic organometallic compounds, said one or more hydrolytic organometallic compounds being compounds that form metal hydroxides through hydrolysis; and a photosensitizer which forms water under irradiation with active rays, wherein said composition forms a metal oxide when irradiated with active rays and then heat treated.

2. A composition for forming a metal oxide thin film pattern as claimed in claim 1, wherein said solution further contains a photosensitizer which forms an acid under irradiation with active rays.

3. A composition for forming a metal oxide thin film pattern as claimed in claim 2, wherein the concentration of said photosensitizer which forms an acid under irradiation with active rays in said composition is within a range of from 0.001 to 20 wt. %, and the total concentration of said photosensitizer which forms water under irradiation with active rays and said photosensitizer which forms an acid under irradiation with active rays is up to 20 wt. % each of said concentrations being based on the total weight of the composition.

4. A composition for forming a metal oxide thin film pattern according to claim 2, which consists essentially of said solution of one or more hydrolytic organometallic compounds, said photosensitizer which forms water under irradiation with active rays and said photosensitizer which forms an acid under irradiation with active rays.

5. A composition for forming a metal oxide thin film pattern as claimed in claim 1, wherein said photosensitizer which forms water under irradiation with active rays is at least one compound selected from the group consisting of o-nitrobenzyl alcohol and 1-hydroxymethyl-2-nitronaphthalene.

6. A composition for forming a metal oxide thin film pattern according to claim 1, wherein the concentration of said one or more hydrolytic metal compounds in said composition is within a range of from 1 to 20 wt. %, and the concentration of said photosensitizer which forms water under irradiation with active rays is within a range of from 0.001 to 20 wt. %, each of said concentrations being based on the total weight of the composition.

7. A composition for forming a metal oxide thin film pattern according to claim 1, wherein said one or more hydrolytic organometallic compounds are selected from the group consisting of metal alkoxides, metal acetylacetonate complexes and metal carboxylates.

8. A composition for forming a metal oxide thin film pattern according to claim 7, wherein said metal carboxylate is an acetate or a propionate.

9. A composition for forming a metal oxide thin film pattern according to claim 1, wherein said composition is a solution in an organic solvent.

10. A composition for forming a metal oxide thin film pattern according to claim 1, which consists essentially of said solution of one or more hydrolytic organometallic compounds and said photosensitizer which forms water under irradiation with active rays.

11. A composition for forming a metal oxide thin film pattern according to claim 1, further comprising a stabilizing agent selected from the group consisting of acetylacetone, ethanolamine and ethyl oxo-butanoic acid.

12. A composition for forming a metal oxide thin film pattern according to claim 1, wherein said one or more hydrolytic organometallic compounds are selected from the group consisting of lead acetate, zirconium butoxide, titanium isopropoxide, lanthanum acetate, strontium ethoxide, barium ethoxide, magnesium ethoxide, niobium ethoxide, zinc ethoxide, aluminum isopropoxide, tin butoxide, indium ethoxide and lithium ethoxide.

13. A method for forming a metal oxide thin film pattern, which comprises the steps of:

coating the composition of claim 1 onto a substrate to form a coating film, subjecting the resultant coating film to image-forming exposure with active rays, developing the exposed film with a solvent to remove a non-exposed portion, and then heat-treating the developed film to convert the exposed film portion into a metal oxide.

14. A method for forming a metal oxide thin film pattern as claimed in claim 13, wherein said active rays are ultraviolet rays.

15. A composition for forming a metal oxide thin film pattern, which consists essentially of a solution of an organic solvent containing one or more hydrolytic metal halides, a photosensitizer which forms water under irradiation with active rays, and a photosensitizer which forms an acid under irradiation with active rays; and wherein said one or more hydrolytic metal halides are converted into the metal oxide under irradiation with active rays, followed by heat treatment, wherein the metal of said metal halides is at least one member selected from the group consisting of lead, lanthanum, barium, tantalum, titanium, zirconium, aluminum, tin, strontium and ruthenium.

16. A composition for forming a metal oxide thin film pattern as claimed in claim 15, wherein the concentration of said photosensitizer which forms an acid under irradiation with active rays in said composition is within a range of from 0.001 to 20 wt. %, and the total concentration of said photosensitizer which forms water under irradiation with active rays and said photosensitizer which forms an acid under irradiation with active rays is up to 20 wt. % each of said concentrations being based on the total weight of the composition.

17. A method for forming a metal oxide thin film pattern, which comprises the steps of: coating the composition of claim 15 onto a substrate to form a coating film, subjecting the resultant coating film to image-forming exposure with active rays, developing the exposed film with a solvent to remove a non-exposed portion, and then heat-treating the developed film to convert the exposed film portion into a metal oxide.

18. A method for forming a metal oxide thin film pattern as claimed in claim 17, wherein said active rays are ultraviolet rays.

* * * * *